(12) United States Patent
Terunuma

(10) Patent No.: US 6,757,142 B1
(45) Date of Patent: Jun. 29, 2004

(54) MAGNETORESISTIVE EFFECT ELEMENT WITH A MAGNETIC SENSING REGION AND OUTSIDE REGIONS THEREOF, AND MANUFACTURING METHOD OF THE ELEMENT

(75) Inventor: Koichi Terunuma, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/349,119

(22) Filed: Jul. 8, 1999

(30) Foreign Application Priority Data

Jul. 14, 1998 (JP) .......................................... 10/213448

(51) Int. Cl.[7] .............................................. G11B 5/127
(52) U.S. Cl. .................................................. 360/324.1
(58) Field of Search .............................. 360/324.1, 324, 360/324.11, 324.12

(56) References Cited

U.S. PATENT DOCUMENTS 5,206,590 A    4/1993  Dieny et al.
5,883,764 A  * 3/1999  Pinarbasi .................... 360/322
6,091,589 A  * 7/2000  Han et al. ................ 360/327.22

FOREIGN PATENT DOCUMENTS

| JP | 8-221719  | 8/1996 |
| JP | 10-154314 | 6/1998 |

* cited by examiner

Primary Examiner—George J. Letscher
(74) Attorney, Agent, or Firm—Arent Fox Kintner Plotkin & Kahn, PLLC

(57) ABSTRACT

A MR element with a magnetic sensing region and outside regions thereof which locate outside the magnetic sensing region along a track width direction, includes a multi-layered structure with an anti-ferromagnetic thin-film layer, a first ferromagnetic thin-film layer constituted by a single layer of ferromagnetic material or by multi layers of ferromagnetic material, a non-magnetic metal thin-film layer and a second ferromagnetic thin-film layer constituted by a single layer of ferromagnetic material or by multi layers of ferromagnetic material which are sequentially formed on a substrate. The all layers in the multi-layered structure exist in the magnetic sensing region, and at least the anti-ferromagnetic thin-film layer with its initial thickness exists in the outside regions.

6 Claims, 3 Drawing Sheets

MAGNETORESISTIVE EFFECT ELEMENT WITH A MAGNETIC SENSING REGION AND OUTSIDE REGIONS THEREOF, AND MANUFACTURING METHOD OF THE ELEMENT

FIELD OF THE INVENTION

The present invention relates to a magnetoresistive effect (MR) element used as a magnetic sensor, a thin-film magnetic head with the MR element and a manufacturing method of the MR element. The present invention particularly relates to a MR element of a thin-film magnetic head for hard disk drive units, and to a manufacturing method of the MR element.

DESCRIPTION OF THE RELATED ART

Recently, thin-film magnetic heads based on spin valve effect of giant magnetoresistive characteristics (GMR) are proposed as magnetic heads with high sensitivity and high output in order to satisfy the requirement for ever increasing data storage densities in today's magnetic storage systems such as hard disk drive units.

The spin valve effect thin-film structure includes first and second thin-film layers of a ferromagnetic material separated by a thin-film layer of non-magnetic material, and an adjacent layer of anti-ferromagnetic material is formed in physical contact with the second ferromagnetic layer to provide exchange bias magnetic field by exchange coupling at the interface of the layers. The magnetization direction in the second ferromagnetic layer is constrained or maintained by the exchange coupling, hereinafter the second layer is called "pinned layer". On the other hand the magnetization direction of the first ferromagnetic layer is free to rotate in response to an externally applied magnetic field, hereinafter the first layer is called "free layer". The direction of the magnetization in the free layer changes between parallel and anti-parallel against the direction of the magnetization in the pinned layer, and hence the magneto-resistance greatly changes and giant magneto-resistance characteristics are obtained.

Japanese Patent Unexamined Publication No. 04-358310 discloses a spin valve MR sensor which consists of sequentially stacked layers of a bottom layer, a free layer, a non-magnetic layer, a pinned layer and an anti-ferromagnetic layer on a substrate. In this spin valve MR sensor, all the layers except for the bottom and free layers are partly removed to form a magnetic sensing region corresponding to a track width region in case the sensor is used in a magnetic head. In other words, the free layer that will operate as a magnetic sensor exceeds both ends of the magnetic sensing region or the track width region. Therefore, when this spin valve MR sensor is used in the magnetic head, the magnetic sensor will be overlapped on the neighboring tracks and hence this head structure is not effective in more high dense data sensing.

Japanese Patent Unexamined Publication No. 08-221719 discloses a spin valve MR sensor in which a free layer exists only within the track width region. This type of spin valve MR sensor is fabricated by sequentially stacking on a substrate, a lower shield layer, a shield gap layer of an insulation material and a spin valve multi-layered structure which is constituted by a free layer, a non-magnetic metal layer, a pinned layer and an anti-ferromagnetic layer sequentially stacked from the bottom. Then, a specifically patterned resist layer is formed as a mask on the spin valve multi-layered structure by photo-lithographic technique, and ion milling process is implemented to form a specific shaped magnetic sensor of the spin valve multi-layered structure. Namely, the both end portions of the spin valve multi-layered structure, which exceed the magnetic sensing region, are removed away. After this process, magnetic domain control layers and lead conductor layers are formed.

However, according to this Japanese Patent Unexamined Publication No. 08-221719, over-milling onto the spin valve multi-layered structure is necessary at the ion milling process of this structure in order that incomplete milled part of the structure does not exist in any area of the wafer. Namely, the milling process is to be done extending into the shield gap layer exceeding the spin valve multi-layered structure.

As a result of such ion milling, the released particles of the shield gap layer of insulation material such as $Al_2O_3$ are re-deposited on the interface area between the spin valve multi-layered structure, and the magnetic domain control layers and lead conductors to form high electrical resistive residual layers. This results in not only higher electrical resistance of the spin valve MR sensor, but also wider spread of the dispersion in electrical resistance values of such sensors. Furthermore, the over-milling may cause definite degradation of electrical insulation characteristic between the lower shield layer and the spin valve multi-layered structure due to the thinned shield gap layer.

In addition, according to this Japanese Patent Unexamined Publication No. 08-221719, the electrical contact between the spin valve multi-layered structure, and the magnetic domain control layers and the lead conductor layers is only by the cross sectional side interfaces of the patterned spin valve multi-layered structure. More thinly spin valve multi-layered structure and lower height of the stripe from ABS (Air Bearing Surface) or lower MR height result in definite decrease of the electrical contact area and increase of the contact resistance. This increase of the contact resistance may cause shorter life of the sensor due to self-heating and/or electro-migration of the MR sensor. It is possible to enlarge the contact area by making the shape of the cross sectional side interfaces in a greatly tapered shape. However, such shape may invite increase in Barkhousen noise and also increase of the output signal fluctuations.

The above-mentioned problems may be caused not only in such spin valve MR element, but also in an usual anisotropic MR element.

SUMMARY OF THE INVENTION

It is therefore an object of the present invention to provide a MR element, a thin-film magnetic head with the MR element and a manufacturing method of the MR element, whereby electric resistance at the interface between a spin valve multi-layered structure or other MR multi-layered structure and a magnetic domain control layer and a lead conductor layer becomes low and its dispersion can exist in a narrow range.

Another object of the present invention is to provide a MR element, a thin-film magnetic head with the MR element and a manufacturing method of the MR element, whereby electrical contact area at the interface between a spin valve multi-layered structure or other MR multi-layered structure and a magnetic domain control layer and a lead conductor layer becomes more larger.

According to the present invention, a MR element, with a magnetic sensing region and outside regions thereof which locate outside the magnetic sensing region along a track width direction, includes a multi-layered structure with an anti-ferromagnetic thin-film layer, a first ferromagnetic thin-film layer constituted by a single layer of ferromagnetic material or by multi layers of ferromagnetic material, a non-magnetic metal thin-film layer and a second ferromagnetic thin-film layer constituted by a single layer of ferromagnetic material or by multi layers of ferromagnetic material which are sequentially formed on a substrate. The all layers in the multi-layered structure exist in the magnetic sensing region, and at least the anti-ferromagnetic thin-film layer with its initial thickness exists in the outside regions.

In this multi-layered structure, the second ferromagnetic thin-film layer (free layer) is formed in the opposite (upper) side of the substrate, and at least the anti-ferromagnetic thin-film layer with the initial thickness exists in the outside regions of the magnetic sensing region, and hence even when over milling process is implemented to pattern the free layer, an insulation layer under the anti-ferromagnetic thin-film layer is not attacked. Therefore, insulation material particles do not re-deposit on the cross sectional interface area of the spin valve multi-layered structure, the magnetic domain control layers and lead conductor layers, and the interface electrical resistance can become low and its dispersion can be restricted in a narrow range.

Particularly, according to the present invention, at least the anti-ferromagnetic thin-film layer with initial thickness exists in the outside regions of the magnetic sensing region, and therefore re-deposition of particles during the milling process of this anti-ferromagnetic layer is not caused. In general, the resistivity of an anti-ferromagnetic thin-film layer is larger than that of other thin-film layers, and this causes definite increase of the interface resistance when the particles are re-deposited on the interface surface area. When an anti-ferromagnetic thin-film layer is formed of oxide material such as NiO, $Fe_2O_3$ or CoO, the interface resistance is usually degraded. By this reason, non re-deposition of particles of anti-ferromagnetic material gives a great advantage.

Furthermore, the electrical contact area between the spin valve multi-layered structure and the magnetic domain control layers and the lead conductor layers includes not only the tapered side areas at the both ends of the spin valve multi-layered structure, but also the interface area between a part of the upper surface of a layer in the spin valve multi-layered structure and the magnetic domain control layers. Thus, the electrical resistance of the spin valve MR element becomes smaller and the life of the element becomes longer.

It is preferred that, in the outside regions, only the anti-ferromagnetic thin-film layer with its initial thickness exists.

It is also preferred that, in the outside regions, only the anti-ferromagnetic thin-film layer with its initial thickness and the first ferromagnetic thin-film layer with its thinned thickness exist.

It is preferred that, in the outside regions, only the anti-ferromagnetic thin-film layer with its initial thickness and the first ferromagnetic thin-film layer with its initial thickness exist.

It is also preferred that, in the outside regions, only the anti-ferromagnetic thin-film layer with its initial thickness, the first ferromagnetic thin-film layer with its initial thickness and the non-magnetic metal thin-film layer with its initial thickness exist.

It is preferred furthermore that, in the outside regions, magnetic domain control layers which are contact with the second ferromagnetic thin-film layer and the lead conductor layers exist.

According to the present invention, also, a MR element with a magnetic sensing region and outside regions thereof which locate outside the magnetic sensing region along a track width direction, includes a multi-layered structure with a soft-magnetic adjacent layer for magnetic biasing constituted by a single layer or multi layers, a non-magnetic layer and a MR layer constituted by a single layer or multi layers which are sequentially formed on a substrate. The all layers in the multi-layered structure exist in the magnetic sensing region, and at least the soft-magnetic adjacent layer with its thinned thickness exists in the outside regions.

The MR layer is formed on the opposite (upper) side of the substrate, and in the outside regions of the magnetic sensing region, at least the soft-magnetic adjacent layer for magnetic biasing of its partial thickness exists. Therefore, even when over milling process is implemented to pattern the MR layer, an insulation layer under the soft-magnetic adjacent layer for magnetic biasing is not attacked. Thus, insulation material particles do not re-deposit on the cross sectional interface areas between the MR multi-layered structure, and the magnetic domain control layers and the lead conductor layers. As a result, the interface electrical resistance can be lowered and its dispersion can be restricted in a narrow range. Also, the electrical contact area between the MR multi-layered structure and the magnetic domain control layers and the lead conductor layers includes not only the tapered side areas at the both ends of the MR multi-layered structure, but also the interface area between a part of the upper surface of a layer in the MR multi-layered structure and the magnetic domain control layers. Thus, the electrical resistance of the MR element becomes smaller and the life of the element becomes longer.

Furthermore, according to the present invention, a method of manufacturing a MR element, with a magnetic sensing region and outside regions thereof which locate outside the magnetic sensing region along a track width direction, the method includes the step of sequentially forming, on a substrate, an anti-ferromagnetic thin-film layer, a first ferromagnetic thin-film layer constituted by a single layer of ferromagnetic material or by multi layers of ferromagnetic material, a non-magnetic metal thin-film layer and a second ferromagnetic thin-film layer constituted by a single layer of ferromagnetic material or by multi layers of ferromagnetic material, and the steps of removing, in the outside regions, the layers except for at least the anti-ferromagnetic thin-film layer with its initial thickness.

It is preferred that the removing step includes the step of removing, in the outside regions, the layers to leave only the anti-ferromagnetic thin-film layer with its initial thickness.

It is also preferred that the removing step includes the step of removing, in the outside regions, the layers to leave only the anti-ferromagnetic thin-film layer with its initial thickness and the first ferromagnetic thin-film layer with its thinned thickness.

It is preferred that the removing step includes the step of removing, in the outside regions, the layers to leave only the anti-ferromagnetic thin-film layer with its initial thickness and the first ferromagnetic thin-film layer with its initial thickness.

It is also preferred that the removing step includes the step of removing, in the outside regions, the layers to leave only the anti-ferromagnetic thin-film layer with its initial thickness, the first ferromagnetic thin-film layer with its initial thickness and the non-magnetic metal thin-film layer with its initial thickness It is preferred furthermore that the removing step includes the step of executing ion milling the layers in the outside regions.

It is preferred that the method further includes the step of forming magnetic domain control layers which are contact with the second ferromagnetic thin-film layer and lead conductor layers in the outside regions.

Also, according to the present invention, a method of manufacturing a magnetoresistive effect element, with a magnetic sensing region and outside regions thereof which locate outside the magnetic sensing region along a track width direction, includes the step of sequentially forming, on a substrate, a soft-magnetic adjacent layer for magnetic biasing constituted by a single layer or multi layers, a non-magnetic layer and a magnetoresistive effect layer constituted by a single layer or multi layers, and the step of removing, in the outside regions, the layers except for at least the soft-magnetic adjacent layer with its thinned thickness.

The magnetic sensing region or track width region exactly means ABS side region of an upper surface of the second ferromagnetic thin-film layer of the spin valve MR element or an upper surface of the MR layer of the anisotropic MR element, which region is defined by the magnetic domain control layers and the lead conductor layers, and its outside regions along the track width direction mean ABS side regions outside the magnetic sensing region or track width region of the upper surface. However, the side surfaces at the both ends of the MR multi-layered structure are tapered. Thus, the ABS side region between the both sloped end surfaces of the second ferromagnetic thin-film layer or the MR layer is considered as its magnetic sensing or track width region, and the ABS side regions of each layer outside its magnetic sensing or track width region along the track width direction is considered as its outside region along the track width direction.

Further objects and advantages of the present invention will be apparent from the following description of the preferred embodiments of the invention as illustrated in the accompanying drawings.

DESCRIPTION OF THE PREFERRED EMBODIMENTS

Figure 1:
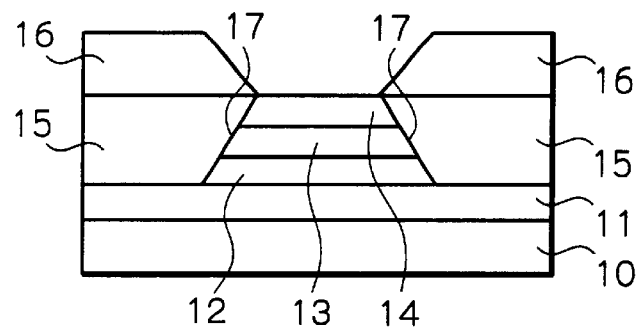
FIG. 1 shows a cross sectional view of a spin valve MR element from ABS direction in a preferred embodiment of the present invention.

FIG. 1 illustrates a spin valve MR element seen from ABS direction in a preferred embodiment of the present invention.

In the figure, reference numeral 10 denotes a shield gap layer formed on a lower shield layer (not shown), 11 an anti-ferromagnetic thin-film layer formed on the shield gap layer 10, 12 a first ferromagnetic thin-film layer (pinned layer) formed on the anti-ferromagnetic thin-film layer 11 within a magnetic sensing region (a region corresponding to a magnetic track width in case the MR element is used in a magnetic head, hereinafter called as a track width region), 13 a non-magnetic metal thin-film layer formed on the first ferromagnetic thin-film layer 12 within the track width region, 14 a second ferromagnetic thin-film layer (free layer) formed on the non-magnetic metal thin-film layer 13 within the track width region, 15 magnetic domain control layers formed in the both outside regions at the both ends of the track width region, 16 lead conductor layers formed on the magnetic domain control layers 15, respectively. Each of the first and the second ferromagnetic thin-film layers 12 and 14 can be constituted by a single layer structure of a ferromagnetic thin-film layer or by a multi-layered structure of thin-film ferromagnetic layers.

The magnetic sensing region or track width region exactly means ABS side region of an upper surface of the free layer 14, which region is defined by the magnetic domain control layers 15 and the lead conductor layers 16, and its outside regions along the track width direction mean ABS side regions outside the magnetic sensing region or track width region of the upper surface of the free layer 14 in the horizontal direction of FIG. 1 (track width direction). In this embodiment, however, the side surfaces at the both ends of the spin valve MR multi-layered structure are tapered. Thus, the ABS side region between the both sloped end surfaces of each of the layers 13 and 12 is considered as its magnetic sensing or track width region, and the ABS side regions of each of the layers 13 and 12 outside its magnetic sensing or track width region along the track width direction is considered as its outside region along the track width direction. Since actually total thickness of the spin valve multi-layered structure is very thin as a few nm, there is no large difference in the widths of the magnetic sensing regions of the respective layers.

In this embodiment, the free layer 14, the non-magnetic metal thin-film layer 13 and the pinned layer 12 are completely removed in the outside regions along the track width direction, and the anti-ferromagnetic thin-film layer 11 is completely left in the outside regions. On the interface areas 17 between the side areas at the both ends of each of the free layer 14, the non-magnetic metal thin-film layer 13 and the pinned layer 12, and the magnetic domain control layers 15 and the lead conductor layers 16, there is no high resistance layer usually caused by re-deposition of released particles of insulation material. Therefore, the electrical resistance at the interface 17 can become low and its dispersion can be restricted in a narrow range.

Particularly, according to this embodiment, since the free layer 14, the non-magnetic metal thin-film layer 13 and the pinned layer 12 are completely removed in the outside regions along the track width direction and the anti-ferromagnetic thin-film layer 11 of its initial thickness is left in the outside regions, re-deposition of particles of the anti-ferromagnetic thin-film layer 11 is not caused because of no ion milling onto the anti-ferromagnetic thin-film layer.

In general, the resistivity of an anti-ferromagnetic thin-film layer 11 is larger than that of other thin-film layers, and this causes definite increase of the interface resistance if the particles are re-deposited onto the interface surface area. Particularly, when an anti-ferromagnetic thin-film layer is formed of oxide material such as NiO, $Fe_2O_3$ or CoO, the interface resistance will more increase. By this reason, non re-deposition of particles of anti-ferromagnetic material of the layer 11 gives a great advantage.

In addition, the magnetic domain control layers 15 and the lead conductor layers 16 electrically contact to both the tapered side areas at the both ends of the free layer 14, non-magnetic metal thin-film layer 13 and pinned layer 12, and a part of the upper surface of the anti-ferromagnetic thin-film layer 11. Thus, the areas of electrical contact of them become very large, and the electrical resistance of the spin valve MR element becomes smaller and the life of the element becomes longer due to restriction of heating.

Figure 2A:
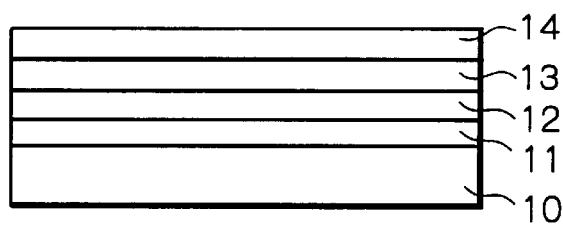
FIGS. 2a to 2c show cross sectional views of the spin valve MR element in the embodiment of FIG. 1 seen from ABS direction to explain its manufacturing process.
Figure 2B:
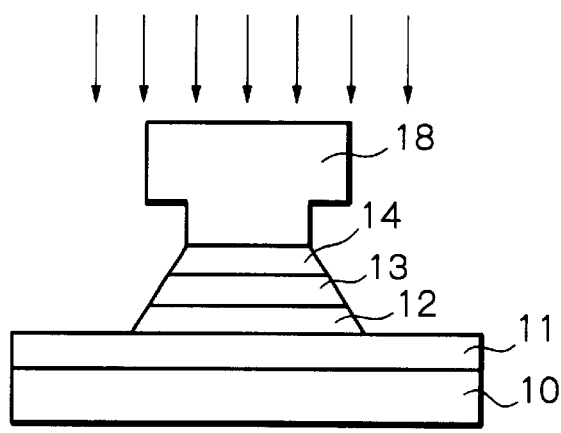
Figure 2C:
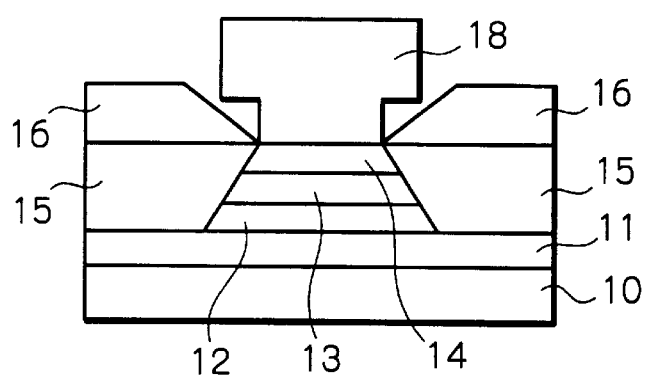

FIGS. 2a to 2c illustrate manufacturing process of the spin valve MR element of the embodiment of FIG. 1 by cross sectional views from ABS direction.

First, as shown in FIG. 2a, on the lower shield layer, the shield gap layer 10, anti-ferromagnetic thin-film layer 11, the first ferromagnetic thin-film layer 12, the non-magnetic metal thin-film layer 13 and the second ferromagnetic thin-film layer 14 are sequentially deposited.

The shield gap layer 10 is made of an insulation material such as $Al_2O_3$, $SiO_2$ or others, the anti-ferromagnetic thin-film layer 11 is made of Mn family alloy material such as FeMn alloy, NiMn alloy or PtMn alloy or of oxide material such as $Fe_2O_3$ or NiO. The first ferromagnetic thin-film layer 12 and the second ferromagnetic thin-film layer 14 are made of ferromagnetic material such as NiFe alloy or Co alloy in case of a single layer structure. In case of multi-layered structure, they are made of stacked layers of ferromagnetic material such as NiFe alloy or Co alloy. The non-magnetic metal thin-film layer 13 is made of non-magnetic metal material such as Cu or others.

As for an under layer of the anti-ferromagnetic thin-film layer 11 and/or an over coating layer of the second ferromagnetic thin-film layer 14, a material such as Ta, Hf or Nb can be applied.

The thickness of the anti-ferromagnetic thin-film layer 11 is in a range of about 5–25 nm in case of FeMn of non-supper lattice structure material, and in a range of about 15–40 nm in case of PtMn of supper lattice structure material. The thickness of the first ferromagnetic thin-film layer 12 is in a range of about 3–15 nm, that of the non-magnetic metal thin-film layer 13 in a range of about 1.5–5 nm, and that of the second ferromagnetic thin-film layer 14 in a range of about 0.5–5 nm, respectively.

Then, as shown in FIG. 2b, a resist 18 processed by photo-lithography having a predetermined pattern to define the magnetic sensing region or track width region is formed on the spin valve multi-layered structure, and ion milling using the resist 18 as the mask is implemented. This ion milling processing, as shown in FIG. 2b, completely removes the second ferromagnetic thin-film layer 14, the non-magnetic metal thin-film layer 13 and the first ferromagnetic thin-film layer 12 in the outside regions along the track width direction, and the milling is stopped without over milling in order that the anti-ferromagnetic thin-film layer 11 is not attacked by the ion milling and can keep its initial thickness in the outside regions. In this ion milling process, the removed layers are not insulation material, and hence even if the released particles are re-deposited on the surfaces at the both ends of the second ferromagnetic thin-film layer 14, non-magnetic metal thin-film layer 13 and the first ferromagnetic thin-film layer 12, the electrical contact resistance of the MR element does not become large.

After that, as shown in FIG. 2c, using the resist mask 18, the magnetic domain control layers 15 and the lead conductor layer 16 are formed in order.

The magnetic domain control layer 15 may be constituted by a single layer structure of a layer of permanent magnet material such as CoPt, CoPtCr or others, by a multi-layered layer structure of the above-mentioned single layer and an under layer of Cr or others, or by a multi-layered structure of layers of such permanent magnet material and NiFe or Co family amorphous alloy. The magnetic domain control layer 15 can be constituted by a multi-layered structure of layers of ferromagnetic materials such as NiFe and anti-ferromagnetic materials such as Mn family or oxides. The lead conductor layer 16 is made of conductive materials such as Ta, Cu, Au or others. The thickness of each of the magnetic domain control layer 15 and the lead conductor layer 16 is in a range of about 10–200 nm.

Figure 3:
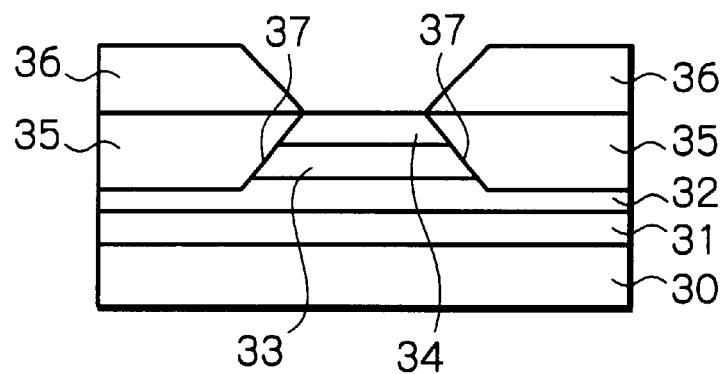
FIG. 3 shows a cross sectional view of a spin valve MR element from ABS direction in another embodiment of the present invention.

FIG. 3 illustrates a spin valve MR element seen from ABS direction in another embodiment of the present invention.

In the figure, reference numeral 30 denotes a shield gap layer formed on a lower shield layer (not shown), 31 an anti-ferromagnetic thin-film layer formed on the shield gap layer 30, 32 a first ferromagnetic thin-film layer (pinned layer) formed on the anti-ferromagnetic thin-film layer 31 within a magnetic sensing region or a track width region, 33 a non-magnetic metal thin-film layer formed on the first ferromagnetic layer 32 within the track width region, 34 a second ferromagnetic thin-film layer (free layer) formed on the non-magnetic metal thin-film layer 33 within the track width region, 35 magnetic domain control layers formed in the both outside regions along the track width direction, 36 lead conductor layers formed on the magnetic domain control layers 35, respectively. Each of the first and the second ferromagnetic thin-film layers 32 and 34 can be constituted by a single layer structure of a ferromagnetic thin-film layer or by a multi-layered structure of thin-film ferromagnetic layers.

The magnetic sensing region or track width region exactly means ABS side region of an upper surface of the free layer 34, which region is defined by the magnetic domain control layers 35 and the lead conductor layers 36, and its outside regions along the track width direction means ABS side regions outside the magnetic sensing region or track width region of the upper surface of the free layer 34 in the horizontal direction of FIG. 3 (track width direction). In this embodiment, however, the side surfaces at the both ends of the spin valve MR multi-layered structure are tapered. Thus, the ABS side region between the both sloped end surfaces of each of the layers 33 and 32 is considered as its magnetic sensing or track width region, and the ABS side regions of each of the layers 33 and 32 outside its magnetic sensing or track width region along the track width direction is considered as its outside region along the track width direction. Since actually total thickness of the spin valve multi-layered structure is very thin as a few nm, there is no large difference in the widths of the layer sensing regions of the respective layers.

In this embodiment, the free layer 34 and the non-magnetic metal thin-film layer 33 are completely removed in the outside regions along the track width direction and the upper portion of the pinned layer 32 is removed in the outside regions along the track width direction. Namely, the pinned layer 32 with its thinned or partial thickness is left in the outside regions. On the interface areas 37 between the side areas at the both ends of each of the free layer 34, the non-magnetic metal thin-film layer 33 and the upper portion of the pinned layer 32, and the magnetic domain control layers 35 and the lead conductor layers 36, there is no high resistance layer usually caused by re-deposition of released particles of insulation material. Therefore, the electrical resistance at the interface 37 can become low and its dispersion can be restricted in a narrow range.

Also, the magnetic domain control layers 35 and the lead conductor layers 36 electrically contact to both the tapered side areas at the both ends of the free layer 34, the non-magnetic metal thin-film layer 33 and the upper portion of the pinned layer 32, and a part of the upper surface of the pinned layer 32. Thus, the areas of electrical contact of them become very large, and the electrical resistance of the spin valve MR element becomes smaller and the life of the element becomes longer due to restriction of heating.

Other structures, advantages, manufacturing processes, materials of layers and thickness of the layers in this embodiment are quite similar to those in the embodiment of FIG. 1.

Figure 4:
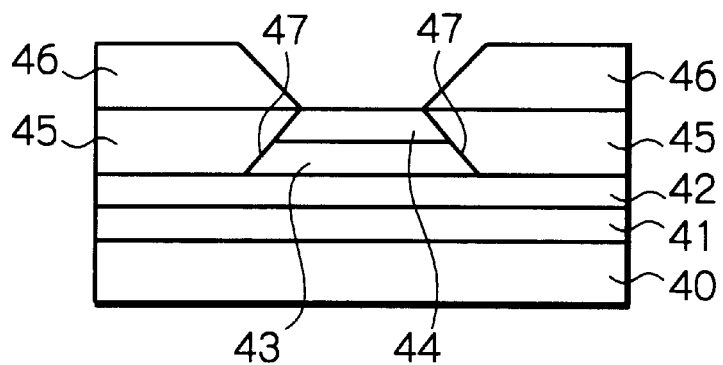
FIG. 4 shows a cross sectional view of a spin valve MR element from ABS direction in a further embodiment of the present invention.

FIG. 4 illustrates a spin valve MR element seen from ABS direction in a further embodiment of the present invention.

In the figure, reference numeral 40 denotes a shield gap layer formed on a lower shield layer (not shown), 41 an anti-ferromagnetic thin-film layer formed on the shield gap layer 40, 42 a first ferromagnetic thin-film layer (pinned layer) formed on the anti-ferromagnetic thin-film layer 41, 43 a non-magnetic metal thin-film layer formed on the first ferromagnetic layer 42 within a magnetic sensing region or a track width region, 44 a second ferromagnetic thin-film layer (free layer) formed on the non-magnetic metal thin-film layer 43 within the track width region, 45 magnetic domain control layers formed in the both outside regions along the track width direction, 46 lead conductor layers formed on the magnetic domain control layers 45, respectively. Each of the first and second ferromagnetic thin-film layers 42 and 44 can be constituted by a single layer structure of a ferromagnetic thin-film layer or by a multi-layered structure of thin-film ferromagnetic layers.

The magnetic sensing region or track width region exactly means ABS side region of an upper surface of the free layer 44, which region is defined by the magnetic domain control layers 45 and the lead conductor layers 46, and its outside regions along the track width direction mean ABS side regions outside the magnetic sensing region or track width region of the upper surface of the free layer 44 in the horizontal direction of FIG. 4 (track width direction). In this embodiment, however, the side surfaces at the both ends of the spin valve MR multi-layered structure are tapered. Thus, the ABS side region between the both sloped end surfaces of the layer 43 is considered as its magnetic sensing or track width region, and the ABS side regions of the layer 43 outside its magnetic sensing or track width region along the track width direction is considered as its outside region along the track width direction. Since actually total thickness of the spin valve multi-layered structure is very thin as a few nm, there is no large difference in the widths of the magnetic sensing regions of the respective layers.

In this embodiment, the free layer 44 and the non-magnetic metal thin-film layer 43 are completely removed in the outside regions along the track width direction and the pinned layer 42 of its initial thickness and the anti-ferromagnetic layer 41 of its initial thickness are left. On the interface areas 47 between the side areas at the both ends of each of the free layer 44 and the non-magnetic metal thin-film layer 43, and the magnetic domain control layers 45 and the lead conductor layers 46, there is no high resistance layer usually caused by re-deposition of released particles of insulation material. Therefore, the electrical resistance at the interface 47 can become low and its dispersion can be restricted in a narrow range.

Also, the magnetic domain control layers 45 and the lead conductor layers 46 electrically contact to both the tapered side areas at the both ends of the free layer 44 and the non-magnetic metal thin-film layer 43, and a part of the upper surface of the pinned layer 42. Thus, the areas of electrical contact of them become very large, and the electrical resistance of the spin valve MR element becomes smaller and the life of the element becomes longer due to restriction of heating.

Other structures, advantages, manufacturing processes, materials or layers and thickness of the layers in this embodiment are quite similar to those in the embodiment of FIG. 1.

Figure 5:
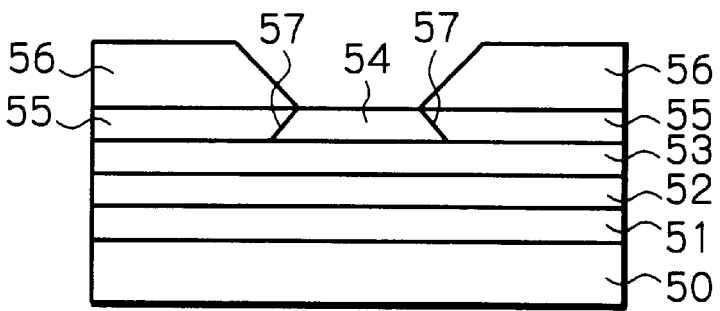
FIG. 5 shows a cross sectional view of a spin valve MR element from ABS direction in a still further embodiment of the present invention.

FIG. 5 illustrates a spin valve MR element seen from ABS direction in a still further embodiment of the present invention.

In the figure, reference numeral 50 denotes a shield gap layer formed on a lower shield layer (not shown), 51 an anti-ferromagnetic thin-film layer formed on the shield gap layer 50, 52 a first ferromagnetic thin-film layer (pinned layer) formed on the anti-ferromagnetic thin-film layer 51, 53 a non-magnetic metal thin-film layer formed on the first ferromagnetic layer 52, 54 a second ferromagnetic thin-film layer (free layer) formed on the non-magnetic metal thin-film layer 53 within a magnetic sensing region or a track width region, 55 magnetic domain control layers formed in the both outside regions along the track width direction, 56 lead conductor layers formed on the magnetic domain control layers 55, respectively. Each of the first and the second ferromagnetic thin-film layers 52 and 54 can be constituted by a single layer structure of a ferromagnetic thin-film layer or by a multi-layered structure of thin-film ferromagnetic layers.

The magnetic sensing region or track width region exactly means ABS side region of an upper surface of the free layer 54, which region is defined by the magnetic domain control layers 55 and the lead conductor layers 56, and its outside regions along the track width direction mean ABS side regions outside the magnetic sensing region or track width region of the upper surface of the free layer 54 in the horizontal direction of FIG. 5 (track width direction).

In this embodiment, only the free layer 54 is completely removed in the outside regions along the track width direction, and the non-magnetic metal thin-film layer 53 of its initial thickness, the pinned layer 52 of its initial thickness and the anti-ferromagnetic layer 51 of its initial thickness are left. On the interface areas 57 between the side areas at the both ends of the free layer 54, and the magnetic domain control layers 55 and the lead conductor layers 56, there is no high resistance layer usually caused by re-deposition of released particles of insulation material. Therefore, the electrical resistance at the interface 57 can become low and its dispersion can be restricted in a narrow range.

Also, the magnetic domain control layers 55 and the lead conductor layers 56 electrically contact to both the tapered side areas at the both ends of the free layer 54, and a part of the upper surface of the non-magnetic metal thin-film layer 53. Thus, the areas of electrical contact of them become very large, and the electrical resistance of the spin valve MR element becomes smaller and the life of the element becomes longer due to restriction of heating.

Other structures, advantages, manufacturing processes, materials of layers and thickness of the layers in this embodiment are quite similar to those in the embodiment of FIG. 1.

Figure 6:
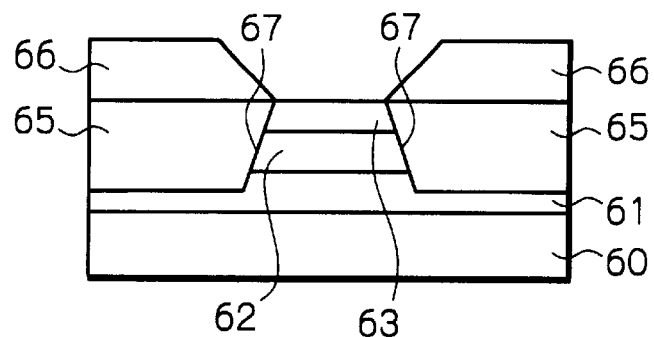
FIG. 6 shows a cross sectional view of an anisotropic MR element from ABS direction in a further embodiment of the present invention.

FIG. 6 illustrates an anisotropic MR element seen from ABS direction in a further embodiment of the present invention.

In the figure, reference numeral 60 denotes a shield gap layer formed on a lower shield layer (not shown), 61 a soft-magnetic adjacent layer (SAL) for lateral magnetic biasing formed on the shield gap layer 60, 62 a non-magnetic intermediate layer formed on the SAL 61 within a magnetic sensing region (a region corresponding to a magnetic track width in case the MR element is used in a magnetic head, hereinafter called as a track width region), 63 a MR layer formed on the non-magnetic intermediate layer 62 within the track width region, 65 magnetic domain control layers formed in the both outside regions at the both ends of the track width region, 66 lead conductor layers formed on the magnetic domain control layers 65, respectively. Each of the MR layer 63 and the SAL 61 can be constituted by a single layer structure or by a multi-layered structure.

The magnetic sensing region or track width region exactly means ABS side region of an upper surface of the MR layer 63, which region is defined by the magnetic domain control layers 65 and the lead conductor layers 66, and its outside regions along the track width direction mean ABS side regions outside the magnetic sensing region or track width region of the upper surface of the MR layer 63 in the horizontal direction of FIG. 6 (track width direction). In this embodiment, however, the side surfaces at the both ends of the MR multi-layered structure are tapered. Thus, the ABS side region between the both sloped end surfaces of each of the layers 62 and 61 is considered as its magnetic sensing or track width region, and the ABS side regions of each of the layers 62 and 61 outside the magnetic sensing or track width region along the track width direction is considered as its outside region along the track width direction.

In this embodiment, the MR layer 63 and the non-magnetic intermediate layer 62 are completely removed in the outside regions along the track width direction, and the upper portion of the SAL 61 is removed in the outside regions along the track width direction, by ion milling. Namely, the SAL 61 of its thinned or partial thickness is left in the outside regions. On the interface areas 67 between the side areas at the both ends of each of the MR layer 63, the non-magnetic intermediate layer 62 and the upper portion of the SAL 61, and the magnetic domain control layers 65 and the lead conductor layers 66, there is no high resistance layer usually caused by re-deposition of released particles of insulation material. Therefore, the electrical resistance at the interface 67 can become low and its dispersion can be restricted in a narrow range.

Also, the magnetic domain control layers 65 and the lead conductor layers 66 electrically contact to both the tapered side areas at the both ends of the MR layer 63, the non-magnetic intermediate layer 62 and the upper portion of the SAL 61, and a part of the upper surface of the SAL 61. Thus, the areas of electrical contact of them become very large, and the electrical resistance of the MR element becomes smaller and the life of the element becomes longer due to restriction of heating.

The shield gap layer 60 is made of an insulation material such as $Al_2O_3$, $SiO_2$ or others. The SAL 61 is made of an Co amorphous material such as NiFeX, NiFeCoX (where X is Cr, Ta, Vb, Hf, Nb or others). The thickness of the SAL 61 is in a range of about 5–30 nm. The non-magnetic intermediate layer 62 is made of a non-magnetic metal material such as Ta, Ti, Mo, Nb, Hf, Cu or others, of an alloy metal of them, or of a non-magnetic insulation material such as $Al_2O_3$, $SiO_2$, SiN, AlN or others. The thickness of the layer 62 is in a range of about 2–30 nm. The MR layer 63 is made of an alloy metal of NiFe, NiFeCo or others. The thickness of the MR layer 63 is in a range of about 5–30 nm.

As for an under layer of the SAL 61 and/or an over coating layer of the MR layer 63, a material such as Ta, Hf or Nb can be applied.

The magnetic domain control layer 65 may be constituted by a single layer structure of a layer of permanent magnet material such as CoPt, CoPtCr or others, by a multi-layered layer structure of the above-mentioned single layer and an under layer of Cr or others, or by a multi-layered structure of layers of such permanent magnet material and NiFe or Co family amorphous alloy. The magnetic domain control layer 65 can be constituted by a multi-layered structure of layers of ferromagnetic materials such as NiFe and anti-ferromagnetic materials such as Mn family or oxides. The lead conductor layer 66 is made of conductive materials such as Ta, Cu, Au or others. The thickness of each of the magnetic domain control layer 65 and the lead conductor layer 66 is in a range of about 10–200 nm.

As described above, the ion milling processing is stopped at a middle point in the comparatively thicker layer, SAL 61, and hence milling control is easy. This is very effective for manufacturing process of such devices.

Other structures, advantages, manufacturing processes, materials of layers and thickness of the layers in this embodiment are quite similar to those in the embodiment of FIG. 1.

Figure 7:
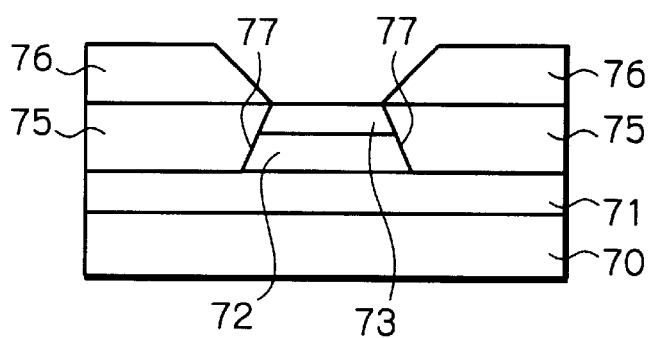
FIG. 7 shows a cross sectional view of an anisotropic MR element from ABS direction in a still further embodiment of the present invention.

FIG. 7 illustrates an anisotropic MR element seen from ABS direction in a still further embodiment of the present invention.

In the figure, reference numeral 70 denotes a shield gap layer formed on a lower shield layer (not shown), 71 a soft-magnetic adjacent layer (SAL) for lateral magnetic biasing formed on the shield gap layer 70, 72 a non-magnetic intermediate layer formed on the SAL 71 within a magnetic sensing region or a track width region, 73 a MR layer formed on the non-magnetic intermediate layer 72 within the track width region, 75 magnetic domain control layers formed in the both outside regions at the both ends of the track width region, 76 lead conductor layers formed on the magnetic domain control layers 75, respectively. Each of the MR layer 73 and the SAL 71 can be constituted by a single layer structure or by a multi-layered structure.

The magnetic sensing region or track width region exactly means ABS side region of an upper surface of the MR layer 73, which region is defined by the magnetic domain control layers 75 and the lead conductor layers 76, and its outside regions along the track width direction mean ABS side regions outside the magnetic sensing region or track width region of the upper surface of the MR layer 73 in the horizontal direction of FIG. 7 (track width direction). In this embodiment, however, the side surfaces at the both ends of the MR multi-layered structure are tapered. Thus, the ABS side region between the both sloped end surfaces of the layer 72 is considered as its magnetic sensing or track width region, and the ABS side regions of the layer 72 outside the magnetic sensing or track width region along the track width direction is considered as its outside region along the track width direction.

In this embodiment, the MR layer 73 and the non-magnetic intermediate layer 72 are completely removed in the outside regions along the track width direction, and the SAL 71 of its initial thickness is left in the outside regions, by ion milling. On the interface areas 77 between the side areas at the both ends of each of the MR layer 73 and the non-magnetic intermediate layer 72, and the magnetic domain control layers 75 and the lead conductor layers 76, there is no high resistance layer usually caused by re-deposition of released particles of insulation material. Therefore, the electrical resistance at the interface 77 can become low and its dispersion can be restricted in a narrow range.

Also, the magnetic domain control layers 75 and the lead conductor layers 76 electrically contact to both the tapered side areas at the both ends of the MR layer 73 and the non-magnetic intermediate layer 72, and a part of the upper surface of the SAL 71. Thus, the areas of electrical contact of them become very large, and the electrical resistance of the MR element becomes smaller and the life of the element becomes longer due to restriction of heating.

The materials and thickness of layers in this embodiment are just the same as those in the embodiment of FIG. 6.

As for an under layer of the SAL 71 and/or an over coating layer of the MR layer 73, a material such as Ta, Hf or Nb can be applied.

Other structures, advantages, manufacturing processes, materials of layers and thickness of the layers in this embodiment are quite similar to those in the embodiment of FIG. 1.

Figure 8:
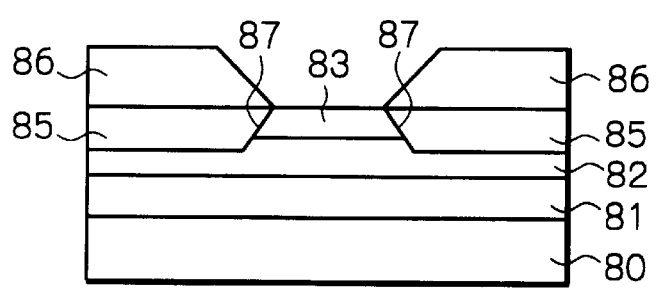
FIG. 8 shows a cross sectional view of an anisotropic MR element from ABS direction in a further embodiment of the present invention.

FIG. 8 illustrates an anisotropic MR element seen from ABS direction in a further embodiment of the present invention.

In the figure, reference numeral 80 denotes a shield gap layer formed on a lower shield layer (not shown), 81 a soft-magnetic adjacent layer (SAL) for lateral magnetic biasing formed on the shield gap layer 80, 82 a non-magnetic intermediate layer formed on the SAL 81, 83 a MR layer formed on the non-magnetic intermediate layer 82 within a magnetic sensing region or a track width region, 85 magnetic domain control layers formed in the both outside regions at the both ends of the track width region, 86 lead conductor layers formed on the magnetic domain control layers 85, respectively. Each of the MR layer 83 and the SAL 81 can be constituted by a single layer structure or by a multi-layered structure.

The magnetic sensing region or track width region exactly means ABS side region of an upper surface of the MR layer 83, which region is defined by the magnetic domain control layers 85 and the lead conductor layers 86, and its outside regions along the track width direction mean ABS side regions outside the magnetic sensing region or track width region of the upper surface of the MR layer 83 in the horizontal direction of FIG. 8 (track width direction). In this embodiment, however, the side surfaces at the both ends of the MR multi-layered structure are tapered. Thus, the ABS side region between the both sloped end surfaces of the layer 82 is considered as its magnetic sensing or track width region, and the ABS side regions of the layer 82 outside the magnetic sensing or track width region along the track width direction is considered as its outside region along the track width direction.

In this embodiment, the MR layer 83 is completely removed in the outside regions along the track width direction, and the upper portion of the non-magnetic intermediate layer 82 is removed in the outside regions, by ion milling. Namely, the non-magnetic intermediate layer 82 of its thinned or partial thickness is left in the outside regions. On the interface areas 87 between the side areas at the both ends of each of the MR layer 83 and the non-magnetic intermediate layer 82, and the magnetic domain control layers 85 and the lead conductor layers 86, there is no high resistance layer usually caused by re-deposition of released particles of insulation material. Therefore, the electrical resistance at the interface 87 can become low and its dispersion can be restricted in a narrow range.

Also, the magnetic domain control layers 85 and the lead conductor layers 86 electrically contact to both the tapered side areas at the both ends of the MR layer 83 and the non-magnetic intermediate layer 82, and a part of the upper surface of the non-magnetic intermediate layer 82. Thus, the areas of electrical contact of them become very large, and the electrical resistance of the MR element becomes smaller and the life of the element becomes longer due to restriction of heating.

The materials and thickness of layers in this embodiment are just the same as those in the embodiment of FIG. 6.

As described above, the ion milling processing is stopped at a middle point in the comparatively thicker layer, non-magnetic intermediate layer 82, and hence milling control is easy. This is very effective for manufacturing process of such devices.

Other structures, advantages, manufacturing processes, materials of materials and thickness of the layers in this embodiment are quite similar to those in the embodiment of FIG. 1.

Figure 9:
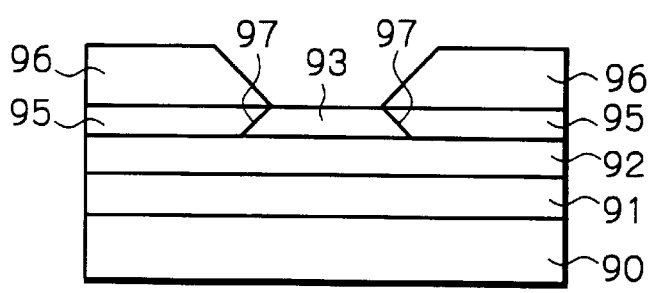
FIG. 9 shows a cross sectional view of an anisotropic MR element from ABS direction in a still further embodiment of the present invention.

FIG. 9 illustrates an anisotropic MR element seen from ABS direction in a still further embodiment of the present invention.

In the figure, reference numeral 90 denotes a shield gap layer formed on a lower shield layer (not shown), 91 a soft-magnetic adjacent layer (SAL) for lateral magnetic biasing formed on the shield gap layer 90, 92 a non-magnetic intermediate layer formed on the SAL 91, 93 a MR layer formed on the non-magnetic intermediate layer 92 within a magnetic sensing region or a track width region, 95 magnetic domain control layers formed in the both outside regions at the both ends of the track width region, 96 lead conductor layers formed on the magnetic domain control layers 95, respectively. Each of the MR layer 93 and the SAL 91 can be constituted by a single layer structure or by a multi-layered structure.

The magnetic sensing region or track width region exactly means ABS side region of an upper surface of the MR layer 93, which region is defined by the magnetic domain control layers 95 and the lead conductor layers 96, and its outside regions along the track width direction mean ABS side regions outside the magnetic sensing region or track width region of the upper surface of the MR layer 93 in the horizontal direction of FIG. 9 (track width direction).

In this embodiment, the MR layer 93 is completely removed in the outside regions along the track width direction, and the non-magnetic intermediate layer 92 of its initial thickness and the SAL 91 of its initial thickness are left in the outside regions, by ion milling. On the interface areas 97 between the side areas at the both ends of the MR layer 93, and the magnetic domain control layers 95 and the lead conductor layers 96, there is no high resistance layer usually caused by re-deposition of released particles of insulation material. Therefore, the electrical resistance at the interface 97 can become low and its dispersion can be restricted in a narrow range.

Also, the magnetic domain control layers 95 and the lead conductor layers 96 electrically contact to both the tapered side areas at the both ends of the MR layer 93, and a part of the upper surface of the non-magnetic intermediate layer 92. Thus, the areas of electrical contact of them become very large, and the electrical resistance of the MR element becomes smaller and the life of the element becomes longer due to restriction of heating.

The materials and thickness of layers in this embodiment are just the same as those in the embodiment of FIG. 6.

Other structures, advantages, manufacturing processes, materials of layers and thickness of the layers in this embodiment are quite similar to those in the embodiment of FIG. 1.

Many widely different embodiments of the present invention may be constructed without departing from the spirit and scope of the present invention. It should be understood that the present invention is not limited to the specific embodiments described in the specification, except as defined in the appended claims.

What is claimed is:

1. A magnetoresistive effect element with a magnetic sensing region and outside regions thereof which are located on both sides of said magnetic sensing region along a track width direction, said element comprising:
   a multi-layered structure with an anti-ferromagnetic thin-film layer,
   a first ferromagnetic thin-film layer constituted by a single layer of ferromagnetic material or by multi layers of ferromagnetic material,
   a non-magnetic metal thin-film layer and a second ferromagnetic thin-film layer constituted by multi layers of ferromagnetic material, which are sequentially formed on a substrate in such an order,
   wherein each layer in said multi-layered structure is disposed in said magnetic sensing region,
   wherein at least said anti-ferromagnetic thin-film layer with its initial thickness extends from said magnetic sensing region to exist in both said outside regions, and
   wherein side surfaces at both ends of said multi-layered structure are tapered.

2. The element as claimed in claim 1, wherein, in said outside regions, said anti-ferromagnetic thin-film layer with its initial thickness and said first ferromagnetic thin-film film layer with its thinned thickness exist.

3. The element as claimed in claim 1, wherein, in said outside regions, said anti-ferromagnetic thin-film layer with its initial thickness and said first ferromagnetic thin-film layer with its initial thickness exist.

4. The element as claimed in claim 1, wherein, in said outside regions, said anti-ferromagnetic thin-film layer with its initial thickness, said first ferromagnetic thin-film layer with its initial thickness and said non-magnetic metal thin-film layer with its initial thickness exist.

5. The element as claimed in claim 1, wherein, in said outside regions, magnetic domain control layers which are contact with said second ferromagnetic thin-film layer and the lead conductor layers exist.

6. A thin-film magnetic head comprising said magnetoresistive effect element claimed in claim 1.

* * * * *